United States Patent
Deng

(10) Patent No.: US 9,647,015 B2
(45) Date of Patent: May 9, 2017

(54) METHOD FOR MANUFACTURING ARRAY SUBSTRATE AND ARRAY SUBSTRATE MANUFACTURED THEREFOR

(71) Applicant: SHENZHEN CHINA STAR OPTOELECTRONICS TECHNOLOGY CO., LTD., Shenzhen, Guangdong (CN)

(72) Inventor: Zhuming Deng, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/774,051

(22) PCT Filed: Jul. 31, 2015

(86) PCT No.: PCT/CN2015/085659
§ 371 (c)(1),
(2) Date: Sep. 9, 2015

(87) PCT Pub. No.: WO2017/008344
PCT Pub. Date: Jan. 19, 2017

(65) Prior Publication Data
US 2017/0018580 A1  Jan. 19, 2017

(30) Foreign Application Priority Data

Jul. 16, 2015 (CN) .......................... 2015 1 0420271

(51) Int. Cl.
*H01L 27/12* (2006.01)

(52) U.S. Cl.
CPC ........ *H01L 27/1288* (2013.01); *H01L 27/124* (2013.01); *H01L 27/1218* (2013.01); *H01L 27/1248* (2013.01); *H01L 27/1262* (2013.01)

(58) Field of Classification Search
CPC ............. H01L 27/1288; H01L 27/1248; H01L 27/124; H01L 27/1218; H01L 27/1262
See application file for complete search history.

(56) References Cited

U.S. PATENT DOCUMENTS

| | | | |
|---|---|---|---|
| 8,816,346 B2* | 8/2014 | Wang | H01L 27/1214 257/202 |
| 8,952,365 B2* | 2/2015 | Nishiyama | C23C 14/083 257/40 |
| 9,354,453 B2* | 5/2016 | Jun | G02B 27/26 |
| 2007/0090364 A1* | 4/2007 | Lan | H01L 27/14603 257/72 |
| 2016/0211277 A1* | 7/2016 | Yan | H01L 27/1248 |

* cited by examiner

*Primary Examiner* — Mamadou Diallo
(74) *Attorney, Agent, or Firm* — Kirton McConkie; Evan R. Witt

(57) ABSTRACT

A method for manufacturing an array substrate is disclosed and includes steps of: sequentially forming a first metal layer, an insulating layer and a second metal layer on a glass substrate; forming a passivation layer on the second metal layer; performing a first etching process on the passivation layer to obtain a first groove and a second groove; performing a second etching process on the passivation layer to obtain a third groove; and forming a pixel electrode layer on the passivation layer. The method saves one photomask and a photolithography step, thereby reducing the cost and improving the efficiency.

8 Claims, 3 Drawing Sheets

METHOD FOR MANUFACTURING ARRAY SUBSTRATE AND ARRAY SUBSTRATE MANUFACTURED THEREFOR

BACKGROUND OF THE INVENTION

Field of the Invention

The present invention relates to the field of display technologies, and more particularly to a method for manufacturing an array substrate and an array substrate manufactured therefor.

Description of the Related Art

At present, a typical polymer stabilized vertically aligned (PSVA) structure forms four domains within a pixel to reduce color washout. In the prior art, a passivation layer below a pixel electrode layer is subjected to a patterning process, to form two different grooves. The two different grooves with different depths are subjected to an inside-outside combination, and thus achieving an eight-domain display effect, thereby greatly reducing color washout. To implement such structure, a through hole and the grooves with such two different depths will simultaneously exist in a pixel, that is, three different amounts of etching will be implemented. In the existing manufacturing process, three photomasks may be used and three times of photolithography process may be implemented, which causes a significant load in manufacturing cost and efficiency. Although a GTM (Gray Tone Mask) process may be implemented to reduce the number of photomasks and the photolithography processes, the GTM process is much more complicated, wherein many process parameters will have to be adjusted, and the stability and reproducibility of such process are inferior to the typical photomask process.

Therefore, it is necessary to provide a new technical solution to overcome the problems existing in the conventional technology.

SUMMARY OF THE INVENTION

An objective of the present invention is to provide a method for manufacturing an array substrate and an array substrate, wherein the method is capable of saving one photomask and one photolithography process, thereby reducing the cost and improving the efficiency.

In order to solve the above technical problem, the present invention employs the following technical solutions:

A method for manufacturing an array substrate, including steps of:

providing a glass substrate, and sequentially forming a first metal layer and an insulating layer on the glass substrate, wherein the first metal layer includes a plurality of scanning lines;

forming a second metal layer on the insulating layer, wherein the second metal layer includes a plurality of data lines;

forming a passivation layer on the second metal layer;

performing a first etching process on the passivation layer to obtain a first groove and a second groove;

performing a second etching process on the passivation layer to obtain a third groove; and forming a pixel electrode layer on the passivation layer; wherein the first groove and the second groove obtained via the first etching process have the same etching depth; a sum of an etching depth of the third groove and the etching depth of the first groove in the first etching process is greater than or equal to a thickness of the passivation layer.

Preferably, in the method for manufacturing an array substrate, the step of performing a second etching process on the passivation layer to obtain a third groove is to perform the second etching process with respect to a position for forming the third groove and a position corresponding to the first groove on the passivation layer to obtain the third groove and expose the second metal layer.

Preferably, in the method for manufacturing an array substrate, in the second etching process, an etching depth of the first groove is the same as an etching depth of the third groove.

Another method for manufacturing an array substrate, including steps of:

providing a glass substrate, and sequentially forming a first metal layer and an insulating layer on the glass substrate, wherein the first metal layer includes a plurality of scanning lines;

forming a second metal layer on the insulating layer, wherein the second metal layer includes a plurality of data lines;

forming a passivation layer on the second metal layer;

performing a first etching process on the passivation layer to obtain a first groove and a second groove;

performing a second etching process on the passivation layer to obtain a third groove; and forming a pixel electrode layer on the passivation layer.

Preferably, in the method for manufacturing an array substrate, the first groove and the second groove obtained via the first etching process have the same etching depth.

Preferably, in the method for manufacturing an array substrate, a sum of an etching depth of the third groove and the etching depth of the first groove obtained via the first etching process is greater than or equal to a thickness of the passivation layer.

Preferably, in the method for manufacturing an array substrate, the step of performing a second etching process on the passivation layer to obtain a third groove is to perform the second etching process with respect to a position for forming the third groove and a position corresponding to the first groove on the passivation layer to obtain the third groove and expose the second metal layer.

Preferably, in the method for manufacturing an array substrate, in the second etching process, an etching depth of the first groove is the same as an etching depth of the third groove.

An array substrate including:

a glass substrate;

a first metal layer, the first metal layer being arranged on the glass substrate, and the first metal layer comprising a scanning line;

an insulating layer, the insulating layer being arranged on the first metal layer;

a second metal layer, the second metal layer being arranged on the insulating layer, and the second metal layer comprising a data line;

a passivation layer, the passivation layer being arranged on the second metal layer, and the passivation layer comprising a first groove, a second groove, and a third groove; and a pixel electrode layer, the pixel electrode layer being arranged on the passivation layer.

Preferably, in the array substrate, an etching depth of the first groove is greater than an etching depth of the second groove.

Preferably, in the array substrate, a sum of an etching depth of the third groove and an etching depth of the first groove obtain via a first etching process is greater than or equal to a thickness of the passivation layer.

Preferably, in the array substrate, the first groove corresponds to the data lines in position.

Preferably, in the array substrate, the passivation layer is a silicon nitride layer.

Compared with the conventional technologies, the method of the present invention utilizes two etching processes that are performed on the passivation layer where the first groove and the second groove are obtained via the first etching process and have the same depth, and the third groove is obtained via the second etching process, thereby exposing the second metal layer. That is, during the etching process of the second groove and the etching process of the third groove, both of the etching processes perform the same etching effect of the same depth on the first groove, which finally achieves an effect that the first groove is completely etched. As such, one photomask may be saved, and reducing a lithography process, thereby reducing the cost and improving the efficiency.

In order to make the contents of the present invention more easily understood, the preferred embodiments of the present invention are described in detail, in cooperation with accompanying drawings, as follows.

DETAILED DESCRIPTION OF THE PREFERRED EMBODIMENTS

The term "embodiment" is intended to provide an example, an instance or an illustration. As used herein, the singular forms "a" and "an" are intended to include the plural forms as well, unless the context clearly indicates otherwise.

In the present invention, two etching processes are performed on a passivation layer where a first groove and a second groove are obtained via the first etching process and have the same etching depth, and a third groove is obtained via the second etching process, thereby exposing the second metal layer. That is, during the etching process for forming the second groove and the etching process for forming the third groove, both of the etching processes perform the same etching effect of the same etching depth on the position of the first groove, which finally achieves an effect that the first groove is completely etched through. As such, one photomask and one lithography process may be saved, thereby reducing the cost and improving the efficiency.

The technical solution of the present invention is described in detail with reference to the following specific embodiments.

Figure 1:
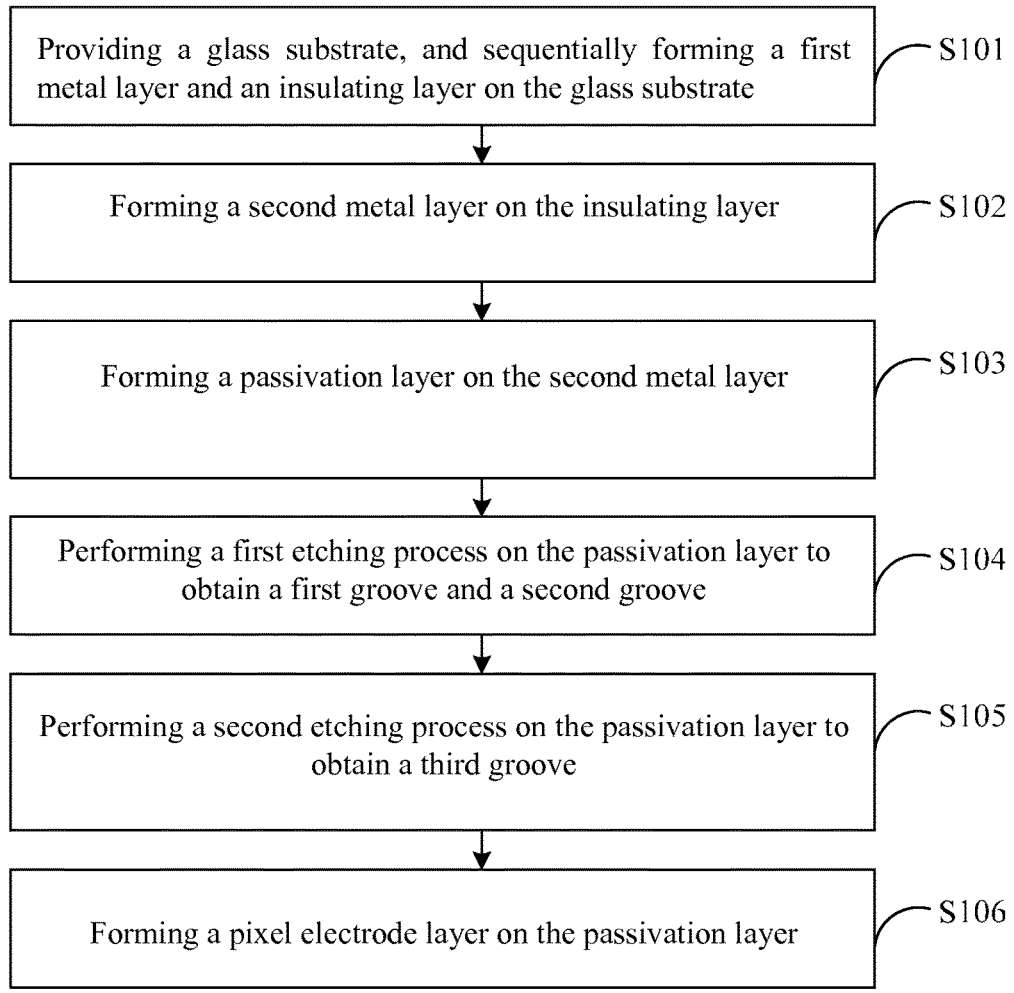
FIG. 1 is a schematic flowchart of a method for manufacturing an array substrate according to an embodiment of the present invention.
Figure 2:
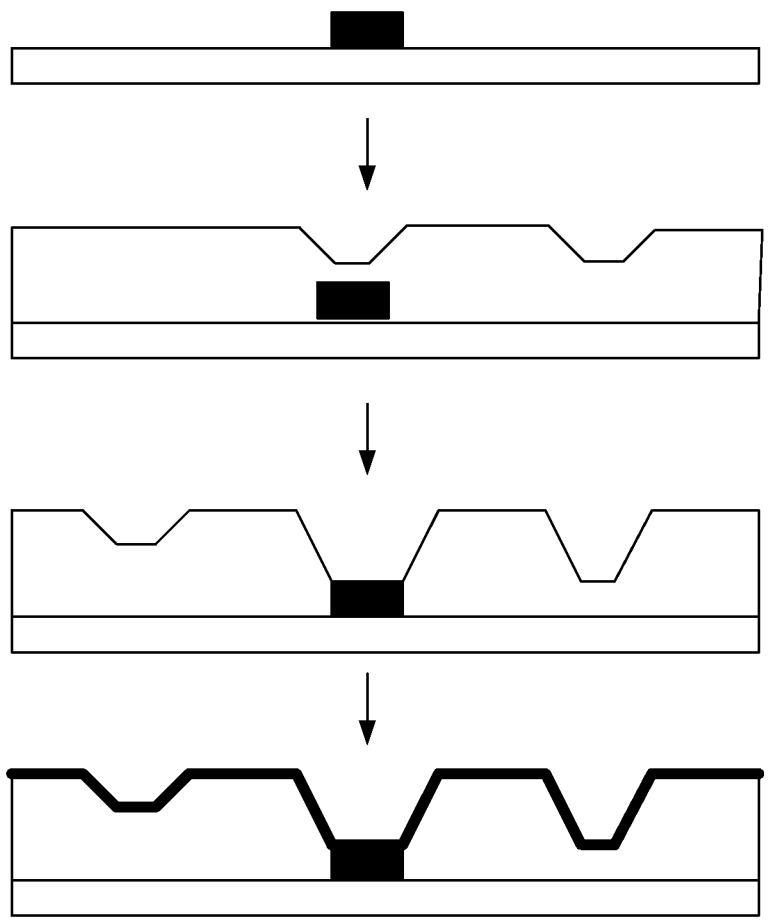
FIG. 2 is a cross-sectional view illustrating steps of the method for manufacturing an array substrate according to an embodiment of the present invention.

Referring to FIG. 1 and FIG. 2, a schematic flowchart of a method for manufacturing an array substrate according to an embodiment of the present invention is shown. The method mainly comprises the following steps:

In step S101, a glass substrate is provided, and a first metal layer and an insulating layer are sequentially formed on the glass substrate, wherein the first metal layer includes a plurality of scanning lines.

In the embodiment of the present invention, after the glass substrate is cleaned, the first metal layer is deposited on the entire surface of the glass substrate by means of a sputtering coating method; photoresist which is photosensitive to ultraviolet light is coated on the second metal layer, and then the photoresist is pre-cured. Subsequently, a photomask is placed above the photoresist and is radiated with (exposed under) ultraviolet light. Afterwards, the photoresist is developed. Finally, the first metal layer is etched to obtain the scanning lines. Then, the insulating layer is formed on the entire surface of the glass substrate by means of chemical vapor deposition. However, it can be understood that the insulating layer may be a silicon nitride layer or a silicon oxide layer.

In step S102, a second metal layer is formed on the insulating layer, wherein the second metal layer includes a plurality of data lines.

In the embodiment of the present invention, the second metal layer is deposited on the insulating layer by means of the sputtering coating method; another photoresist which is photosensitive to ultraviolet light is coated on the second metal layer, and then the photoresist is pre-cured. Subsequently, another photomask is placed above the photoresist and is radiated with (exposed under) ultraviolet light. Afterwards, the photoresist is developed. Finally, the second metal layer is etched to obtain the data lines.

In step S103, a passivation layer is formed on the second metal layer.

In the embodiment of the present invention, the passivation layer is formed on the glass substrate by chemical vapor deposition. However, it can be understood that the insulating layer may be a silicon nitride layer.

In step S104, a first etching process is performed on the passivation layer to obtain a first groove and a second groove.

In the embodiment of the present invention, another photoresist which is photosensitive to ultraviolet light is coated on the passivation layer, and the photoresist is pre-cured. Subsequently, another photomask is placed above the photoresist, and the photomask is radiated with (exposed under) ultraviolet light. Afterwards, the photoresist is developed. Finally, the passivation layer is subjected to the first etching process to obtain the first groove and the second groove. The first groove and the second groove obtained through the first etching process have the same etching depth. That is, the passivation layer is etched to the same depth to form the first groove and the second groove.

In step S105, a second etching process is performed on the passivation layer to obtain a third groove.

In the embodiment of the present invention, the second etching process is performed with respect to a position for forming the third groove and a position corresponding to the first groove on the passivation layer to obtain the third groove, and expose the second metal layer at the position of the first groove. In the second etching process, an etching depth of the first groove is the same as an etching depth of the third groove.

However, it can be understood that a sum of the etching depth of the third groove in the second etching process and the etching depth of the first groove in the first etching process is greater than or equal to a thickness of the passivation layer. That is, as long as the sum of the etching depth for etching the first groove in the first etching process and the etching depth for etching the first groove in the second etching process is greater than or equal to the thickness of the passivation layer, a through hole can be obtained, and the second metal layer can be exposed from the through hole.

For example, the passivation layer has a thickness of 5700 A; the first etching process results in an etching depth of 4000 A, thus the first groove obtained via the first etching process has an etching depth of 4000 A, the second groove also has an etching depth of 4000 A. The second etching process results in an etching depth of 2000 A, wherein only the position of the first groove and the position for forming the third groove are etched during the second etching process. Therefore, the third groove has an etching depth of 2000 A, and the first groove totally has an etching depth of 5700 A.

In step S106, a pixel electrode layer is formed on the passivation layer.

In the embodiment of the present invention, by means of a sputtering coating method, a pixel electrode layer is formed on the passivation layer, wherein the pixel electrode layer includes a plurality of pixel electrodes.

As known from the above, in this embodiment, two times of etching processes are performed on the passivation layer, wherein the first groove and the second groove are obtained via the first etching process and have the same etching depth; the third groove is obtained via the second etching process, and the second metal layer is exposed through the completely-etched first groove. That is, in the present invention, during the etching processes for forming the second groove and the third groove, the first groove is subjected to two times of etching, each time with a certain depth, which finally achieves an effect that the first groove is completely etched through. As such, one photomask and one photolithography process are saved, thereby reducing the cost and improving the efficiency.

Figure 3:
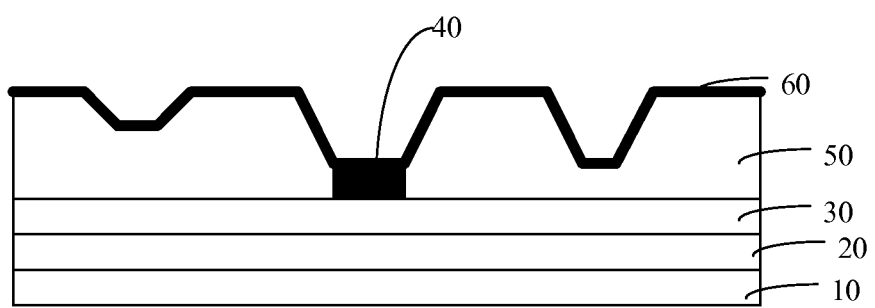
FIG. 3 is a schematic structural view of an array substrate according to an embodiment of the present invention.

FIG. 3 is a schematic structural view of an array substrate according to an embodiment of the present invention. For ease of description, only elements or parts relevant to this embodiment are illustrated.

The array substrate comprises: a glass substrate 10, a first metal layer 20, an insulating layer 30, a second metal layer 40, a passivation layer 50, and a pixel electrode layer 60. The first metal layer 20 is mounted on the glass substrate 10, and the first metal layer 20 includes a plurality of scanning lines. The insulating layer 30 is mounted on the first metal layer 20. The second metal layer 40 is mounted on the insulating layer 20, and the second metal layer 40 includes a plurality of data lines. The passivation layer 50 is mounted on the second metal layer 40, and the passivation layer includes a first groove, a second groove, and a third groove. The pixel electrode layer 60 is mounted on the passivation layer 50, and the pixel electrode layer 60 includes a plurality of pixel electrodes.

In the embodiment of the present invention, an etching depth of the first groove is greater than an etching depth of the second groove. In addition, a sum of an etching depth of the third groove and an etching depth of the first groove etched in a first etching process is greater than or equal to a thickness of the passivation layer. The first groove corresponds to the data lines in position.

However, it can be understood that the passivation layer may be a silicon nitride layer. The insulating layer may be a silicon nitride layer or a silicon oxide layer.

In conclusion, the method of the present invention mainly utilizes two etching processes that are sequentially performed on the passivation layer where the first groove and the second groove are obtained via the first etching process and have the same etching depth, and the third groove is obtained and the first groove is further etched via the second etching process, thereby exposing the second metal layer. That is, during the etching process of the second groove and the etching process of the third groove, both of the etching processes perform the same etching effect of the same etching depth on the first groove, which finally achieves an effect that the first groove is completely etched through. As such, one photomask one lithography process may be saved, thereby reducing the cost and improving the efficiency.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such features may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A method for manufacturing an array substrate, comprising steps of:

providing a glass substrate, and sequentially forming a first metal layer and an insulating layer on the glass substrate, wherein the first metal layer includes a plurality of scanning lines;

forming a second metal layer on the insulating layer, wherein the second metal layer includes a plurality of data lines;

forming a passivation layer on the second metal layer;

performing a first etching process on the passivation layer to obtain a first groove and a second groove;

performing a second etching process on the passivation layer to obtain a third groove; and forming a pixel electrode layer on the passivation layer; wherein the first groove and the second groove obtained via the first etching process have the same etching depth; a sum of an etching depth of the third groove and the etching depth of the first groove in the first etching process is greater than or equal to a thickness of the passivation layer.

2. The method for manufacturing an array substrate as claimed in claim 1, wherein the step of performing a second etching process on the passivation layer to obtain a third groove is to perform the second etching process with respect to a position for forming the third groove and a position corresponding to the first groove on the passivation layer to obtain the third groove and expose the second metal layer.

3. The method for manufacturing an array substrate as claimed in claim 2, wherein in the second etching process, an etching depth of the first groove is the same as an etching depth of the third groove.

4. A method for manufacturing an array substrate, comprising steps of:
   providing a glass substrate, and sequentially forming a first metal layer and an insulating layer on the glass substrate, wherein the first metal layer includes a plurality of scanning lines;
   forming a second metal layer on the insulating layer, wherein the second metal layer includes a plurality of data lines;
   forming a passivation layer on the second metal layer;
   performing a first etching process on the passivation layer to obtain a first groove and a second groove;
   performing a second etching process on the passivation layer to obtain a third groove; and
   forming a pixel electrode layer on the passivation layer.

5. The method for manufacturing an array substrate as claimed in claim 4, wherein the first groove and the second groove obtained via the first etching process have the same etching depth.

6. The method for manufacturing an array substrate as claimed in claim 4, wherein a sum of an etching depth of the third groove and the etching depth of the first groove obtained via the first etching process is greater than or equal to a thickness of the passivation layer.

7. The method for manufacturing an array substrate as claimed in claim 4, wherein the step of performing a second etching process on the passivation layer to obtain a third groove is to perform the second etching process with respect to a position for forming the third groove and a position corresponding to the first groove on the passivation layer to obtain the third groove and expose the second metal layer.

8. The method for manufacturing an array substrate as claimed in claim 7, wherein in the second etching process, an etching depth of the first groove is the same as an etching depth of the third groove.

* * * * *